United States Patent
Hayashi

(10) Patent No.: US 9,112,018 B2
(45) Date of Patent: Aug. 18, 2015

(54) INSULATING SUBSTRATE, METHOD OF MANUFACTURING THE SAME, AND SEMICONDUCTOR DEVICE

(71) Applicant: Hiromasa Hayashi, Miyoshi (JP)

(72) Inventor: Hiromasa Hayashi, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/209,137

(22) Filed: Mar. 13, 2014

(65) Prior Publication Data

US 2014/0291814 A1 Oct. 2, 2014

(30) Foreign Application Priority Data

Mar. 28, 2013 (JP) ................. 2013-070466

(51) Int. Cl.
*H01L 21/30* (2006.01)
*H01L 23/02* (2006.01)
*H01L 21/78* (2006.01)
*H01L 21/66* (2006.01)

(52) U.S. Cl.
CPC ................ *H01L 21/78* (2013.01); *H01L 22/12* (2013.01); *H01L 22/30* (2013.01); *H01L 2924/0002* (2013.01)

(58) Field of Classification Search
CPC ...................... H01L 2224/73265; H01L 27/12; H01L 2224/32245; H01L 27/1203; H01L 2224/131; H01L 29/78603
USPC .......... 438/455, 458, 584, 622, 652; 257/678, 257/700, 723
See application file for complete search history.

(56) References Cited

U.S. PATENT DOCUMENTS

| | | | |
|---|---|---|---|
| 6,998,777 B2* | 2/2006 | Suehiro et al. | 313/512 |
| 8,399,306 B2 | 3/2013 | Koo et al. | |
| 8,649,405 B2* | 2/2014 | Schroder et al. | 372/36 |
| 2011/0017496 A1* | 1/2011 | Hayashi et al. | 174/252 |
| 2011/0177292 A1* | 7/2011 | Teshima et al. | 428/156 |
| 2014/0124915 A1 | 5/2014 | Hayashi et al. | |

FOREIGN PATENT DOCUMENTS

| | | |
|---|---|---|
| JP | 02-072655 A | 3/1990 |
| JP | 2003100965 A | 4/2003 |
| JP | A-2005-317567 | 11/2005 |
| JP | A-2010-212294 | 9/2010 |
| JP | 2012074610 A | 4/2012 |
| WO | 2013002249 A1 | 1/2013 |

OTHER PUBLICATIONS

Partial translation of Jan. 13, 2015 Office Action issued in Japanese Patent Application No. 2013-070466.

* cited by examiner

*Primary Examiner* — Hsien Ming Lee

(74) *Attorney, Agent, or Firm* — Oliff PLC

(57) ABSTRACT

An insulating substrate includes: a transparent insulating layer; a first metal layer that is provided on a first face of the transparent insulating layer; and a second metal layer that is provided on a second face of the transparent insulating layer that is opposite from the first face. The first face of the transparent insulating layer is formed with an exposed section that is an area not provided with the first metal layer. The second metal layer includes an area that is overlapped with the exposed section when seen in an orthogonal direction to the first face.

14 Claims, 9 Drawing Sheets

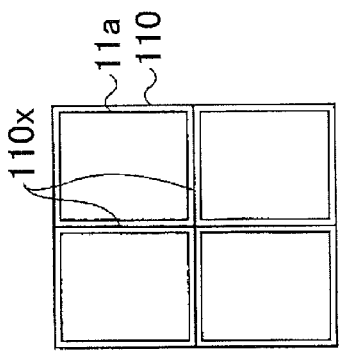
FIG. 5C
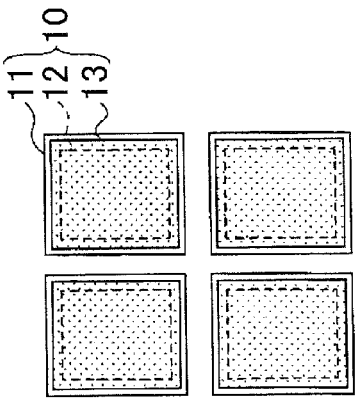
FIG. 5F
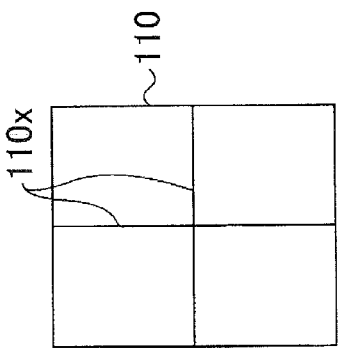
FIG. 5B
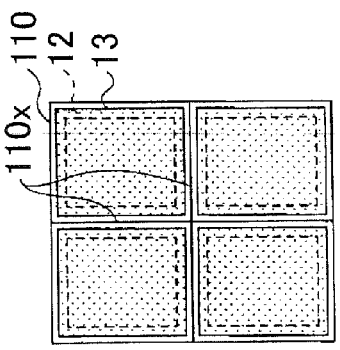
FIG. 5E
FIG. 5A
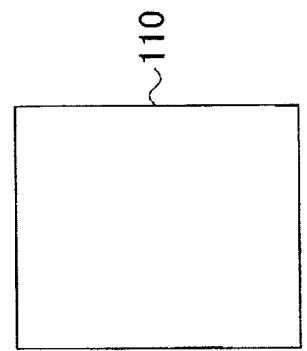
FIG. 5D

INSULATING SUBSTRATE, METHOD OF MANUFACTURING THE SAME, AND SEMICONDUCTOR DEVICE

INCORPORATION BY REFERENCE

The disclosure of Japanese Patent Application No. 2013-070466 filed on Mar. 28, 2013 including the specification, drawings and abstract is incorporated herein by reference in its entirety.

BACKGROUND OF THE INVENTION

1. Field of the Invention

The present invention relates to an insulating substrate, a method of manufacturing the same, and a semiconductor device.

2. Description of Related Art

As a semiconductor device that includes a semiconductor element mounted on an insulating substrate, a semiconductor device that is installed in a vehicle and has a function of power control and the like has been known, for example.

In such a semiconductor device, generally, there is a possibility that a joint portion of soldering or the like that is interposed between the semiconductor element and the insulating substrate or a metal layer (wiring pattern) that is provided in the insulating substrate is peeled or cracked due to a difference in coefficients of linear expansion among materials used for the semiconductor element and the insulating substrate.

A stress caused by the difference in the coefficient of linear expansion is mainly generated at four corners of each component that constitutes the semiconductor device as starting points. Accordingly, the metal layer that is provided in the insulating substrate may be peeled or cracked mainly from four corners toward the center. When peeling or cracking occurs, a portion of the insulating substrate that is peeled or cracked increases thermal resistance, and a heat radiating property of the semiconductor element declines. Therefore, it has been suggested to detect occurrence of peeling or cracking in the insulating substrate based on transitions of temperature or resistance, for example.

However, the occurrence of peeling or cracking cannot be detected directly by a detection method based on the transitions of temperature or resistance but is detected indirectly. Thus, due to the influence of noise or the like, it is difficult to accurately detect the occurrence of peeling or cracking. In other words, it is difficult to identify a portion that is peeled or cracked. In addition, a complex mechanism has to be provided exclusively to manage the temperature or the resistance.

SUMMARY OF THE INVENTION

The present invention provides an insulating substrate and the like that can directly detect peeling or cracking.

An insulating substrate according to a first aspect of the invention includes: a transparent insulating layer; a first metal layer that is provided on a first face of the transparent insulating layer; and a second metal layer that is provided on a second face of the transparent insulating layer that is opposite from the first face. The first face of the transparent insulating layer is formed with an exposed section that is an area not provided with the first metal layer. The second metal layer includes an area that is overlapped with the exposed section when seen in an orthogonal direction to the first face.

A semiconductor device according to a second aspect of the invention includes: the insulating substrate according to the first aspect of the invention; and a semiconductor element that is mounted on the first metal layer.

A method of manufacturing an insulating substrate, according to a third aspect of the invention, includes: forming a first linear groove and a second linear groove on a face of a substrate that includes a plurality of areas respectively corresponding to a plurality of transparent insulating layers; forming the plurality of transparent insulating layers by cutting the substrate along the first linear groove to divide the substrate into individual pieces; forming, in each of first faces of the plurality of the transparent insulating layers, a portion that is provided with a first metal layer and forming, in each of the first faces, an exposed section that is an area not provided with the first metal layer; and forming a second metal layer on a second face of the transparent insulating layer in a manner to include an area that is overlapped with the exposed section when seen in an orthogonal direction to the first face. The first face is located opposite from the second face with respect to the transparent insulating layer. The second linear groove is formed in the area of the transparent insulating layer that is overlapped with the exposed section when seen in the orthogonal direction to the first face.

According to the aspects of the present invention, it is possible to directly detect peeling or cracking.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIGS. 5A to 5F are second bottom views for illustrating the method of manufacturing an insulating substrate according to the modified example 1 of the first embodiment of the present invention;

DETAILED DESCRIPTION OF EMBODIMENTS

Figure 1A:
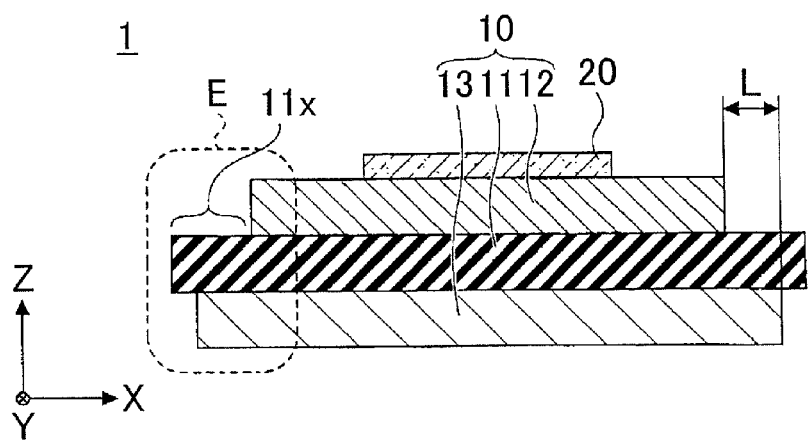
FIGS. 1A and 1B are views that exemplify a semiconductor device according to a first embodiment of the present invention.

A description will hereinafter be made on embodiments of the present invention with reference to the drawings. In each of the drawings, the same components are denoted by the same reference numerals, and repetitive description thereof may be omitted.

Figure 1B:
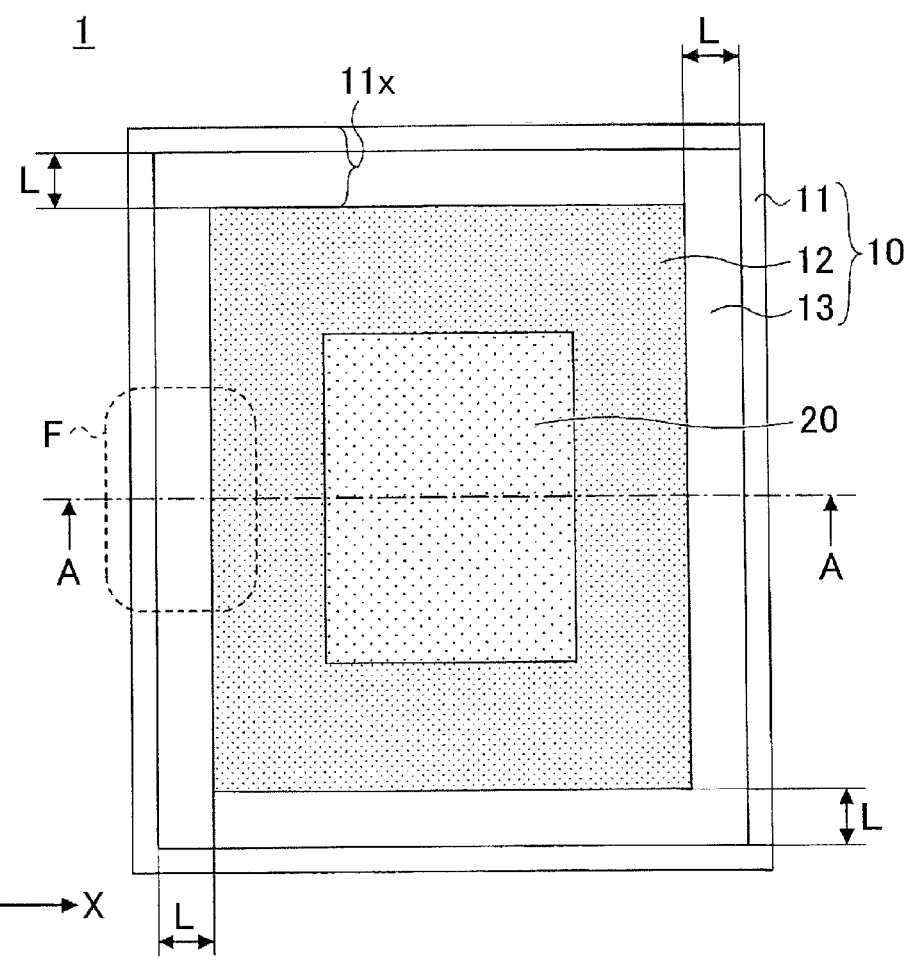

FIGS. 1A and 1B are views that exemplify a semiconductor device according to a first embodiment of the present invention, FIG. 1A is a cross-sectional view, and FIG. 1B is a plan view. FIG. 1A shows a cross section taken along the line A-A in FIG. 1B. In FIG. 1B, a first metal layer 12 and a semiconductor element 20 are shown in a dotted pattern as a matter of convenience.

In FIGS. 1A and 1B, a semiconductor device 1 includes an insulating substrate 10 and the semiconductor element 20. The insulating substrate 10 includes a transparent insulating layer 11, the first metal layer 12, and a second metal layer 13.

The transparent insulating layer 11 is, for example, formed of an insulating material such as transparent ceramics. When the transparent insulating layer 11 is formed of the transparent ceramics, high purity $Al_2O_3$, AlN, YAG, $Al_2O_3$—MgO, $Al_2O_3$—$Y_2O_3$, or the like can be used as a material, for example. In this case, a linear transmittance can be increased by adjusting (reducing) an additive, a sintering aid, or the like or by increasing the density thereof. However, the material for the transparent insulating layer 11 is not limited to ceramics, but an insulating resin or glass may be used.

A planar shape of the transparent insulating layer 11 may be, for example, a square, a rectangle, or the like with a side of about 30 to 50 mm. A thickness of the transparent insulating layer 11 may be, for example, about 0.2 mm to 1.5 mm.

In the first embodiment, being transparent means that a linear transmittance of a visible light (wavelength of between 400 nm and 800 nm) is 20% or higher in an object with 1.5 mm in thickness (a Z-direction in FIG. 1A). Here, the linear transmittance refers to a transmittance of light with which one face of the object is irradiated in an orthogonal direction to another face of the object, and can be measured by a spectrophotometer or the like, for example.

The linear transmittance of the transparent insulating layer 11 is 20% or higher but is preferably 60% or higher and is further preferably 80% or higher. That the linear transmittance of the visible light of the transparent insulating layer 11 is 20% is a minimum condition (limit) for visible recognition of the second metal layer 13 through an exposed section 11x, which will be described below. The visibility is improved when the linear transmittance of the visible light of the transparent insulating layer 11 is 60% or higher, and the visibility is substantially improved at 80% or higher.

In addition, a check of the second metal layer 13 through the exposed section 11x may be performed by a method other than the visual inspection. For example, the second metal layer 13 may be checked by being irradiated with a light from a light source such as a light emitting diode through the exposed section 11x, receiving a reflected light, a scattered light, or the like from the second metal layer 13 with a light receiving element such as a CCD, and performing image processing of an electrical signal that is photo-electrically converted. Also in this case, it is essential that the linear transmittance of the visible light of the transparent insulating layer 11 is 20% or higher; however, it is preferably 60% or higher to promise improvement in inspection accuracy of an inspection machine.

The first metal layer 12 is provided on one face of the transparent insulating layer 11. However, the first metal layer 12 is not provided in the entire face of the transparent insulating layer 11 but is provided to expose an area in a portion of the one face of the transparent insulating layer 11. In the one face of the transparent insulating layer 11, the area where the first metal layer is not provided is referred to as the exposed section 11x. In this embodiment, the exposed section 11x is a frame-shaped area in an outer periphery on the one face of the transparent insulating layer 11. In FIG. 1B, a frame-shaped portion where a dotted pattern is not applied on the transparent insulating layer 11 corresponds to the exposed section 11x. In other words, when seen in a direction orthogonal to the one face of the transparent insulating layer 11, the exposed section 11x corresponds to an area of the transparent insulating layer 11 where the first metal layer 12 and the semiconductor element 20 do not overlap with the transparent insulating layer 11.

The second metal layer 13 is provided on another face of the transparent insulating layer 11 that is opposite from the one face. In this embodiment, a planar shape of the second metal layer 13 is formed larger than a planar shape of the first metal layer 12. More specifically, an outer periphery of the second metal layer 13 is provided such that it can be visually recognized as a frame shape on the outer side of edge sides of the first metal layer 12 through the exposed section 11x in a plan view.

As described above, the second metal layer 13 is provided to include an area that is overlapped with the exposed section 11x in the plan view. The description will be made herein on the assumption that to be "overlapped with the exposed section 11x" includes a case where a portion of the second metal layer 13 is overlapped with the entire exposed section 11x and a case where the portion of the second metal layer 13 is overlapped with a portion of the exposed section 11x.

The plan view herein means to see the object in the direction orthogonal to the one face of the transparent insulating layer 11. In addition, the edge side refers to an outermost linear portion when the object is seen in the plan view, and the outer periphery refers to an area in the proximity of the edge side.

For example, Al, Cu, or the like can be used as a material for the first metal layer 12 and the second metal layer 13. The first metal layer 12 and the second metal layer 13 can be joined to the transparent insulating layer 11 by brazing or the like. The first metal layer 12 and the second metal layer 13 can have a thickness of about 0.2 to 1 mm, for example.

The semiconductor element 20 is mounted on the first metal layer 12 of the insulating substrate 10 with a conductive joining material such as solder (not shown). The semiconductor element 20 is, for example, a power switching element such as an insulated gate bipolar transistor (IGBT) that generates heat during an operation and constitutes an inverter circuit. The heat generated by the semiconductor element 20 is dissipated through the transparent insulating layer 11 that is provided with the first metal layer 12 and the second metal layer 13. A heat radiation component may be provided on the second metal layer 13 side to further improve the heat radiating property.

Here, a description will be made on a technical meaning of providing the second metal layer 13 in a way to include a portion of the exposed section 11x in the plan view.

Figure 2A:
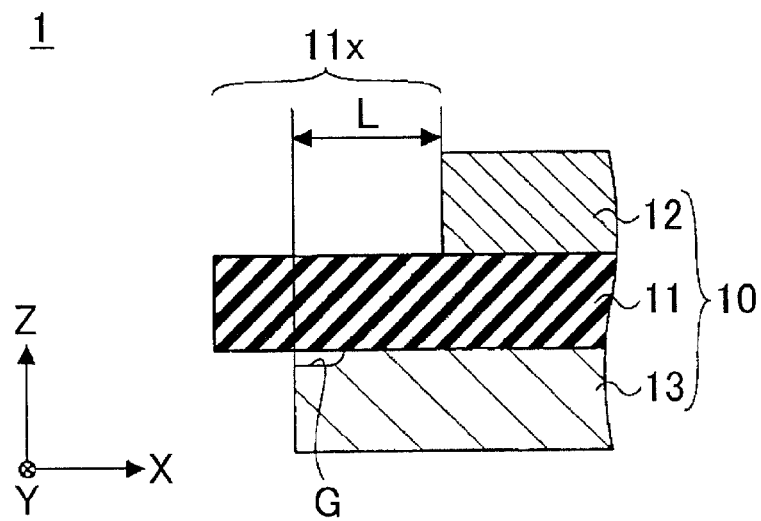
FIGS. 2A and 2B are enlarged views of FIGS. 1A and 1B, respectively.
Figure 2B:
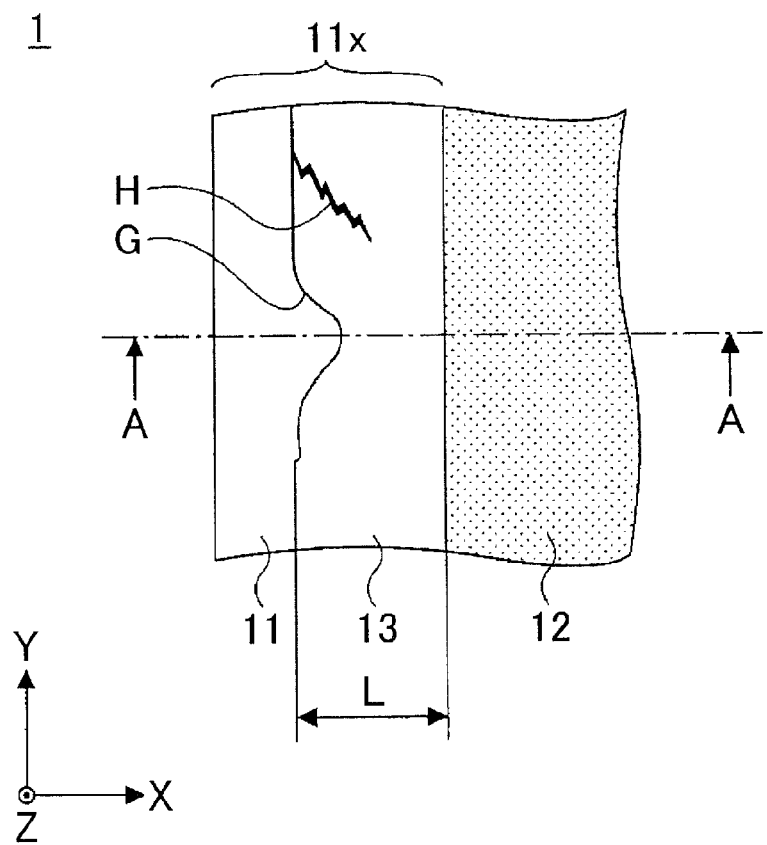

FIGS. 2A and 2B are enlarged views of FIGS. 1A and 1B, respectively. FIG. 2A is a partial cross-sectional view that exemplifies an enlarged portion E of FIG. 1A, and FIG. 2B is a partial plan view that exemplifies an enlarged F portion of FIG. 1B. FIG. 2A shows a cross section taken along the line A-A of FIG. 2B.

As shown in FIGS. 2A and 2B, in an area G, the second metal layer 13 is peeled from the other face of the transparent insulating layer 11. In addition, a cracking H occurs in the second metal layer 13. A reason for the occurrence of peeling or cracking as shown in FIGS. 2A and 2B is because a coefficient of linear expansion of the transparent insulating layer 11 differs from a coefficient of linear expansion of the second metal layer 13.

More specifically, when the semiconductor element 20 is operated and generates heat, the heat is transferred to the transparent insulating layer 11 and the second metal layer 13, and the transparent insulating layer 11 and the second metal layer 13 are thereby thermally expanded. Meanwhile, when the operation of the semiconductor element 20 is terminated, the transparent insulating layer 11 and the second metal layer 13 lower the temperatures thereof by radiating the heat, and the transparent insulating layer 11 and the second metal layer 13 are thereby thermally compressed.

During the thermal expansion or the thermal compression of the transparent insulating layer 11 and the second metal layer 13, the difference in the coefficients of linear expansion thereof causes generation of thermal stress, and consequently peeling or cracking occurs. If peeling or cracking occurs, the thermal resistance of a portion that is peeled or cracked is increased to degrade the heat radiating property, and the semiconductor element 20 becomes overheated. Thus, it is important to inspect whether the occurred peeling or cracking falls within an allowable range or not.

In this embodiment, the first metal layer 12 is provided on the one face of the transparent insulating layer 11 such that the exposed section 11x is formed. The second metal layer 13 is provided on the other face of the transparent insulating layer 11 such that the second metal layer 13 includes a portion of the exposed section 11x in the plan view. Accordingly, it is possible to easily verify the occurrence of peeling or cracking on the second metal layer 13 by visually recognizing the transparent insulating layer 11 from the one face side. That is, visualization of peeling or cracking can be possible.

Conventionally, peeling or cracking has been verified by the indirect inspection based on the transitions of a temperature, resistance, or the like. On the other hand, in this embodiment, peeling or cracking can be inspected directly by visually recognizing the peeling or cracking. Accordingly, compared to the indirect inspection with which it is difficult, due to the influence of noise or the like, to identify a portion where peeling or cracking has occurred, it is possible to surely detect the portion where peeling or cracking has occurred. In addition, this embodiment is preferred because a complex mechanism does not have to be provided exclusively for management of the temperature, resistance, or the like that is carried out in the indirect inspection.

As another method of detecting peeling or cracking, a method of using a transmitted X-ray, an ultrasonic flaw detection method, or the like can be considered. However, the method of using the transmitted X-ray is not preferred as the X-lay may influence a property of the element. In addition, the ultrasonic flaw detection method is not preferred because the inspection is generally carried out under water and thus has a possibility of leading to failure. On the other hand, because the inspection of peeling or cracking in this embodiment does not have any factor to possibly cause failure like the conventional methods using the transmitted X-ray or the ultrasonic flaw detection, it is preferred in a point that it does not influence the property of the element.

Because peeling or cracking occurs at a corner or an edge side of the second metal layer 13 as a starting point, the exposed section 11x is preferably provided in a position where the corner or the edge side of the second metal layer 13 can be visually recognized from the first metal layer 12 side.

It has been known from experiences that a characteristic defect or the like of the semiconductor device caused by peeling or cracking does not occur even in consideration with deterioration if a degree of peeling or cracking detected in an initial inspection is 0.5 mm or less in an inner area from the edge side of the second metal layer 13. The initial inspection refers to an inspection that is carried out when the semiconductor device 1 is manufactured.

There is also a case that peeling or cracking occurs in a portion other than the corner and the edge side of the second metal layer 13. However, when peeling or cracking occurs from the corner or the edge side of the second metal layer 13, peeling or cracking is most likely to progress inward. Thus, it is important to actively detect the occurrence of peeling or cracking from the corner or the edge side of the second metal layer 13.

Considering the above, L in FIGS. 1A and 1B as well as FIGS. 2A and 2B is preferably set between 0.5 mm to 1.0 mm, approximately. The setting of L to be less than 0.5 mm is not preferred because it is impossible in this case to determine whether or not the degree of peeling or cracking reaches 0.5 mm. On the contrary, the setting of L to be longer than 1.0 mm is not preferred either despite the fact that there is no problem with the visibility. It is because a balance is lost between an area of the first metal layer 12 and an area of the second metal layer 13 with the transparent insulating layer 11 being the center, and warpage or stress of the insulating substrate 10 is thereby increased.

In view of the above points, a preferred example in terms of the specification of the insulating substrate 10 is as follows. That is, the linear transmittance of the visible light of the transparent insulating layer 11 is 80% or higher (the material is AlN), the thickness of the transparent insulating layer 11 is about 0.635 mm, the thickness of the first metal layer 12 is about 0.6 mm, the thickness of the second metal layer 13 is about 0.6 mm, and the length of L is about 0.7 mm. However, these numerical values should appropriately be set to match the specification of the semiconductor device to be manufactured and thus are not limited to those in this preferred example.

In a modified example of the first embodiment of the present invention, an example is shown in which a scribe line is provided in a transparent insulating layer. In the modified example of the first embodiment, the description of the same components as those in the embodiment that has already been described will not be repeated.

Figure 3A:
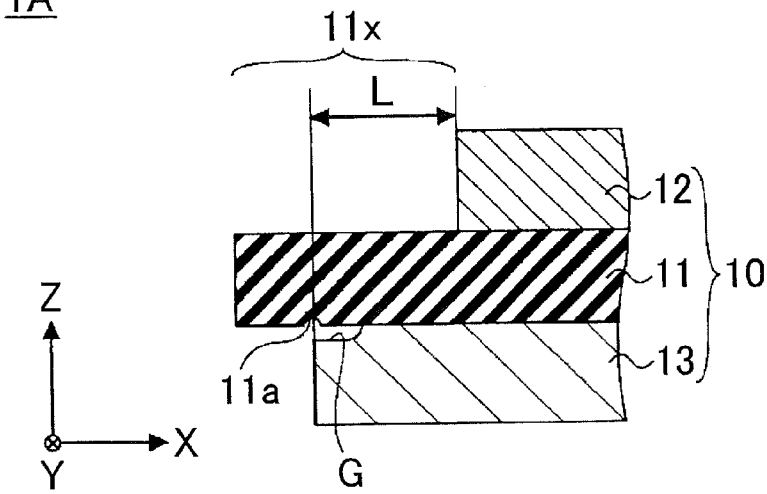
FIGS. 3A and 3B are views that exemplify the semiconductor device according to a modified example 1 of the first embodiment of the present invention.
Figure 3B:
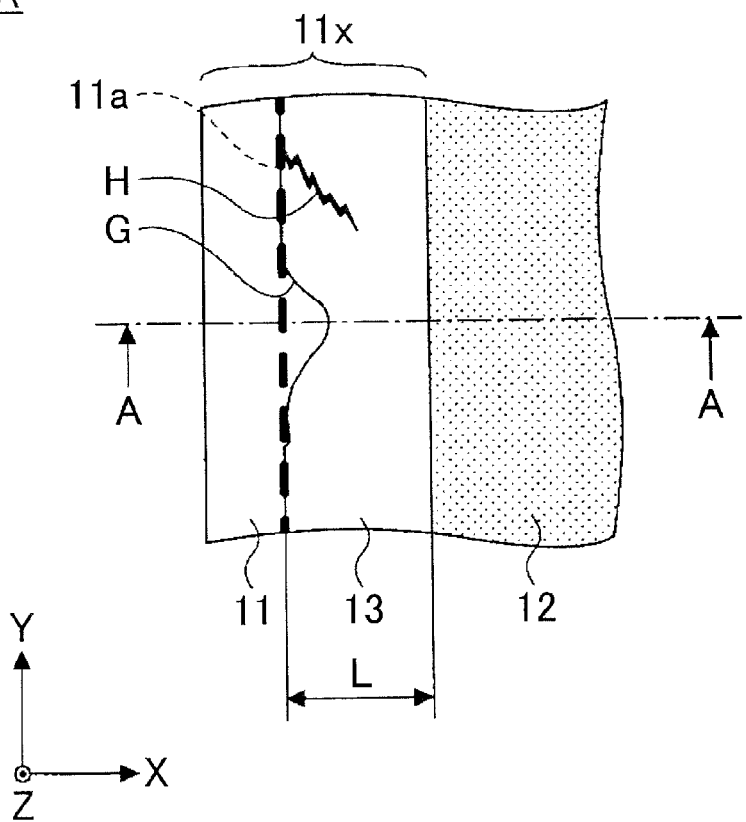

FIGS. 3A and 3B are views that exemplify the semiconductor device according to the modified example of the first embodiment, and FIG. 3A and FIG. 3B respectively correspond to a partial cross-sectional view and a partial plan view. FIG. 3A shows a cross section that is taken along the line A-A of FIG. 3B.

As shown in FIGS. 3A and 3B, in a semiconductor device 1A according to the modified example 1 of the first embodiment, a scribe line 11a is formed on the other face of the transparent insulating layer 11 that in an area overlapped with the exposed section 11x when seen in the plan view. More specifically, the scribe line 11a is formed in a position that matches the edge side of the second metal layer 13 (the edge side when peeling or cracking does not occur in the second metal layer 13) in the plan view.

The scribe line 11a is a linear groove of several μm to tens of μm in width and depth, and is formed by irradiating the other face of the transparent insulating layer 11 with a laser beam, for example. Here, in FIG. 3B, although the scribe line 11a is shown by a broken line as a matter of convenience, the scribe line 11a can be a continuous groove. Meanwhile, the scribe line 11a can also be formed of a plurality of discontinuous portions, if necessary.

Just as described, the scribe line 11a is formed in the position in the other face of the transparent insulating layer 11 that matches the edge side of the second metal layer 13 (the edge side when peeling or cracking does not occur in the second metal layer 13) in the plan view before the second metal layer 13 is provided. Accordingly, peeling or cracking of the second metal layer 13 can be checked with the scribe line 11a being a reference when visually recognized from the one face of the transparent insulating layer 11. Therefore, peeling or cracking can be checked further easily.

In other words, if the scribe line 11a and the edge side of the second metal layer 13 match each other when being visually recognized from the other face side of the transparent insulating layer 11, it can easily determine that peeling or cracking does not occur. On the other hand, if the scribe line 11a and the edge side of the second metal layer 13 do not match each other, it can easily determine that peeling or cracking occurs.

An example of a method of manufacturing the insulating substrate 10 will be described herein. FIGS. 4A to 4E are first bottom views for illustrating a method of manufacturing the insulating substrate according to the modified example 1 of the first embodiment. The bottom views are views that the object is seen from a side where the second metal layer 13 is formed lastly.

Figure 4A:
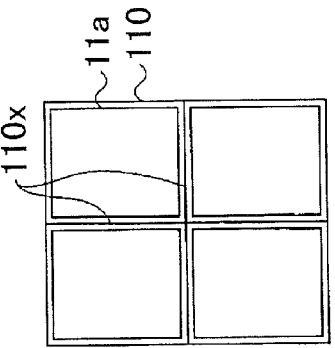
FIGS. 4A to 4E are first bottom views for illustrating a method of manufacturing an insulating substrate according to the modified example 1 of the first embodiment of the present invention.

First, as shown in FIG. 4A, a substrate 110 including a plurality of areas that are divided into individual pieces of the transparent insulating layer 11 is prepared. The substrate 110 can be formed of the insulating material such as transparent ceramics, for example.

Figure 4B:
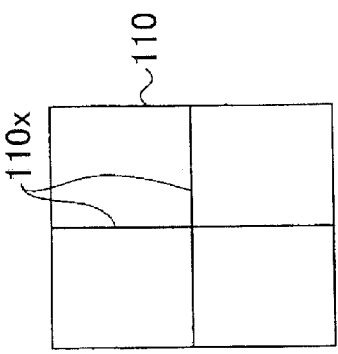

Next, as shown in FIG. 4B, a scribe line 110x (first linear groove) that is used for division into the individual pieces is formed in a face of the substrate 110 on a side where the second metal layer 13 is formed. Here, an example is shown in which the cross-shaped scribe line 110x is formed to divide the substrate 110 into the individual pieces so as to form the four transparent insulating layers 11. Needless to say, the larger substrate may be divided into the individual pieces to form more of the transparent insulating layer 11.

Figure 4C:
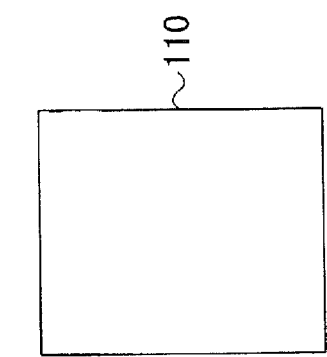

Then, as shown in FIG. 4C, the scribe line 11a (second linear groove) that is used for the inspection of peeling or cracking of the second metal layer 13 is formed in each of the areas in the substrate 110 that finally becomes the transparent insulating layers 11. Although the scribe lines 110x and the scribe line 11a may have a same depth, the scribe line 110x may be formed deeper than the scribe line 11a to achieve easy division into the individual pieces.

The scribe lines 110x and 11a may be formed by irradiating the transparent insulating layers 11 with the laser beam, for example (laser scribe). However, the scribe lines 110x and 11a may be formed by scribing with a needle or the like (mechanical scribe), for example. Although FIG. 4B and FIG. 4C are separate views as a matter of convenience, steps in these drawings can be integrated into a single step using a same device (laser irradiation device or the like).

Figure 4D:
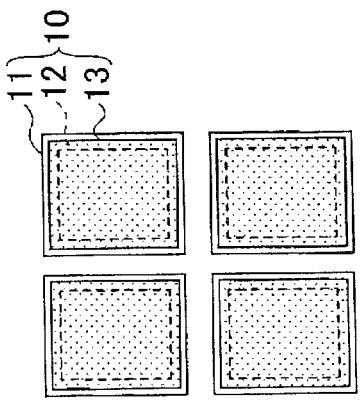

Next, as shown in FIG. 4D, the substrate 110 is cut along the scribe line 110x by using a dicer or the like to form the four transparent insulating layers 11 formed by the individual pieces of the substrate 110. Then, as shown in FIG. 4E, the first metal layer 12 is formed on the one face (back face in FIGS. 4A to 4E) of the transparent insulating layer 11, and the second metal layer 13 is formed on the other face (front face in FIGS. 4A to 4E) of the transparent insulating layer 11.

Here, the second metal layer 13 is formed such that the edge side thereof corresponds to the scribe line 11a. The first metal layer 12 and the second metal layer 13 can be formed by brazing metal plates of such as Cu or Al to the transparent insulating layer 11, for example.

From the above steps, the first metal layer 12 is formed on the one face of each of the transparent insulating layers 11 after being cut, and the second metal layer 13 is faulted on the other face thereof to complete the insulating substrate 10. The one face of each of the transparent insulating layers 11 after being cut is formed with the exposed section 11x that is the area not provided with the first metal layer 12, and the second metal layer 13 is formed to include the area that is overlapped with the exposed section 11x in the plan view.

Figure 4E:
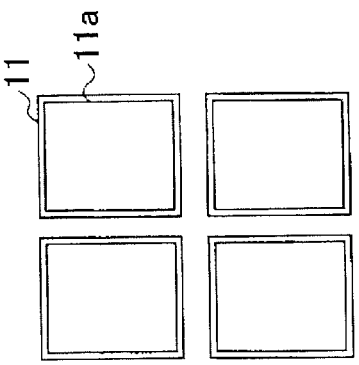

After the step shown in FIG. 4E, the semiconductor element 20 is mounted on the first metal layer 12 with the conductive joining material such as the solder. The insulating substrate 10 in which the semiconductor element 20 is mounted on the first metal layer 12 may further be joined to a heat spreader, a cooler, or the like.

The insulating substrate 10 may be manufactured as follows. FIGS. 5A to 5F are second bottom views for illustrating the method of manufacturing the insulating substrate according to the modified example 1 of the first embodiment.

First, similar to FIGS. 4A to 4C, the scribe lines 110x and 11a are formed on the substrate 110 in FIGS. 5A to 5C. Next, as shown in FIG. 5D, a metal layer 120 that will later become the first metal layer 12 is formed on the one surface (back face in FIGS. 4A to 4E) of the substrate 110, and a metal layer 130 that will later become the second metal layer 13 is formed on the other face (front face in FIGS. 4A to 4E) of the substrate 110. The metal layers 120 and 130 can be formed by brazing the metal plates of such as Cu or Al to the substrate 110, for example.

Next, as shown in FIG. 5E, each of the metal layers 120 and 130 formed on the substrate 110 is etched and partially removed so as to form the first metal layer 12 on the one face (back face in FIGS. 4A to 4E) of the substrate 110 and to form the second metal layer 13 on the other face (front face in FIGS. 4A to 4E) of the substrate 110. Here, the second metal layer 13 is formed such that the edge side thereof corresponds to the scribe line 11a. In this step, the scribe line 110x is exposed in an area of the other face (front face in FIGS. 4A to 4E) of the substrate 110 where the second metal layer 13 is not formed.

Then, as shown in FIG. 5F, the substrate 110 is cut along the scribe line 110x by using the dicer or the like.

From the above steps, the first metal layer 12 is formed on the one face of each of the transparent insulating layers 11 after being cut, and the second metal layer 13 is formed on the other face thereof to complete the insulating substrate 10. The one face of each of the transparent insulating layers 11 after being cut is formed with the exposed section 11x that is the area not provided with the first metal layer 12, and the second metal layer 13 is formed to include the area that is overlapped with the exposed section 11x in the plan view.

After the step shown in FIG. 5F, the semiconductor element 20 is mounted on the first metal layer 12 with the conductive joining material such as the solder. The insulating substrate 10 in which the semiconductor element 20 is mounted on the first metal layer 12 may further be joined to the heat spreader, the cooler, or the like.

As described above, in the manufacturing steps of the insulating substrate 10, the scribe line 110x that is used for the division into the individual pieces and the scribe line 11a that is used for the inspection of peeling or cracking can be formed in a same step by using the same device (such as the laser irradiation device). Accordingly, the scribe line 11a for the inspection can be formed without causing substantial cost increase. In addition, peeling or cracking of the second metal layer 13 can easily be checked with the scribe line 11a being the reference when visually recognized from the one face of the transparent insulating layer 11.

The inspection for peeling or cracking can be carried out at any timing after the step in FIG. 4E or FIG. 5F. For example, the inspection may be carried out immediately after the step in FIG. 4E or FIG. 5F or after the semiconductor element 20 is mounted on the first metal layer 12. Alternatively, the inspection may be carried out after the insulating substrate 10 in which the semiconductor element 20 is mounted on the first metal layer 12 is further joined to the heat spreader, the cooler, or the like.

In a modified example 2 of the first embodiment, an example will be described in which the plural scribe lines are provided in the transparent insulating layer. In the modified example 2 of the first embodiment, the description of the same components as those in the embodiment that has already been described will not be repeated.

Figure 6A:
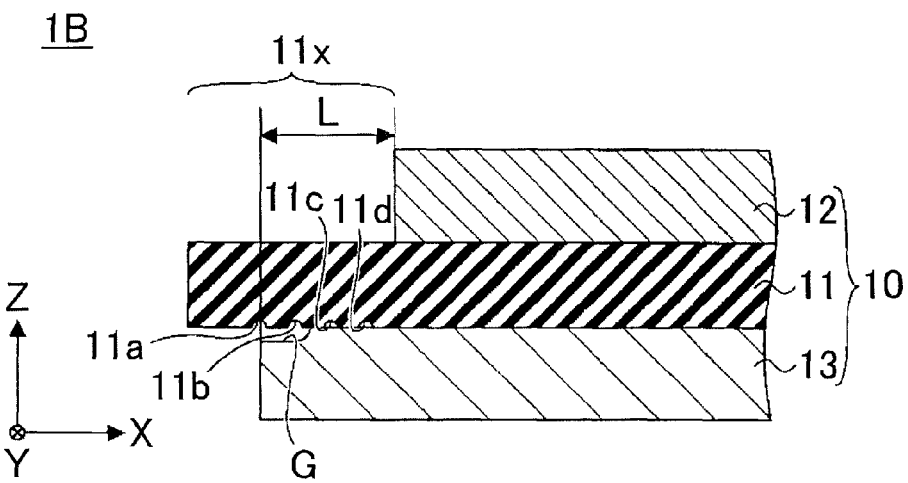
FIGS. 6A and 6B are views that exemplify the semiconductor device according to a modified example 2 of the first embodiment of the present invention.
Figure 6B:
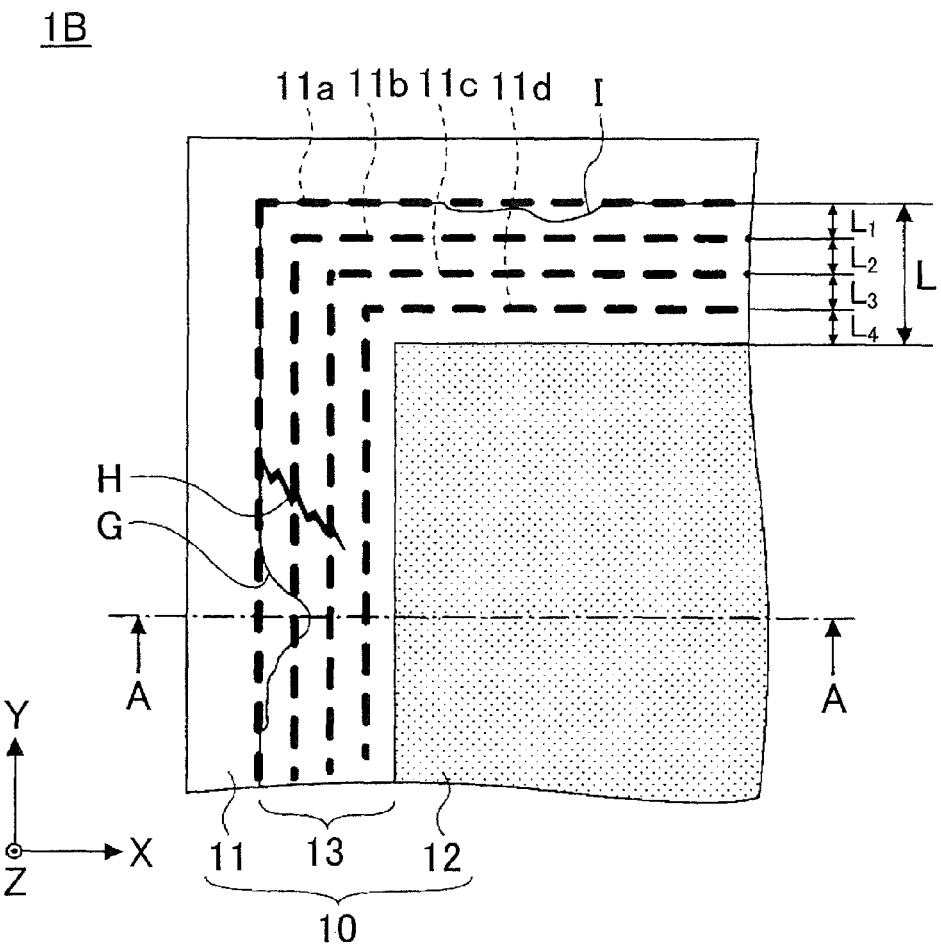

FIGS. 6A and 6B are views that exemplify the semiconductor device according to the modified example 2 of the first embodiment, FIG. 6A is a partial cross-sectional view, and FIG. 6B is a partial plan view. Here, FIG. 6A shows a cross section that is taken along the line A-A of FIG. 6B.

As shown in FIGS. 6A and 6B, in a semiconductor device 1B according to the modified example 2 of the first embodiment, similar to the semiconductor device 1A (see FIGS. 3A and 3B), the scribe line 11a is formed in the area of the other face of the transparent insulating layer 11 that is overlapped with the exposed section 11x in the plan view. More specifically, the scribe line 11a is formed in the position that corresponds to the edge side of the second metal layer 13 (the edge side when peeling or cracking does not occur to the second metal layer 13) in the plan view.

Furthermore, scribe lines 11b, 11c, and 11d as other linear grooves are formed in this order at specified intervals on the inner side of the scribe line 11a in the area of the other face of the transparent insulating layer 11 that is overlapped with the exposed section 11x in the plan view. Each of a space $L_1$ between the scribe lines 11a and 11b, a space $L_2$ between the scribe lines 11b and 11c, a space $L_3$ between the scribe lines 11c and 11d, and a space $L_4$ between the scribe line 11d and the edge side of the first metal layer 12 can be set to about 0.15 to 0.25 mm, for example. If necessary, the spaces $L_1$ to $L_4$ may be set to different values.

In the same step as that of folding the scribe line 11a, the scribe lines 11b to 11d (other linear grooves) can be formed on the inner side of the scribe line 11a in the area of the other face of the transparent insulating layer 11 that is overlapped with the exposed section 11x in the plan view. Here, the same step as that of forming the scribe line 11a is the step shown in FIG. 4C and FIG. 5C.

As described above, it is possible to further quantify the degree of peeling or cracking in detail by providing the plural scribe lines 11a to 11d in the transparent insulating layer 11. For example, when all of the spaces L1 to $L_4$ in FIG. 6B are 0.25 mm, it can be checked that the degree of peeling G is in a range of 0.25 mm to 0.5 mm and a degree of cracking H is in a range of 0.5 mm to 0.75 mm. It can also be checked that a degree of peeling 1 is in a range of 0 mm to 0.25 mm.

A modified example 3 of the first embodiment shows an example in which a slit-like opening is provided in the first metal layer to form the exposed section. In the modified example 3 of the first embodiment, the description of the same components as those that have already been described will not be repeated.

Figure 7A:
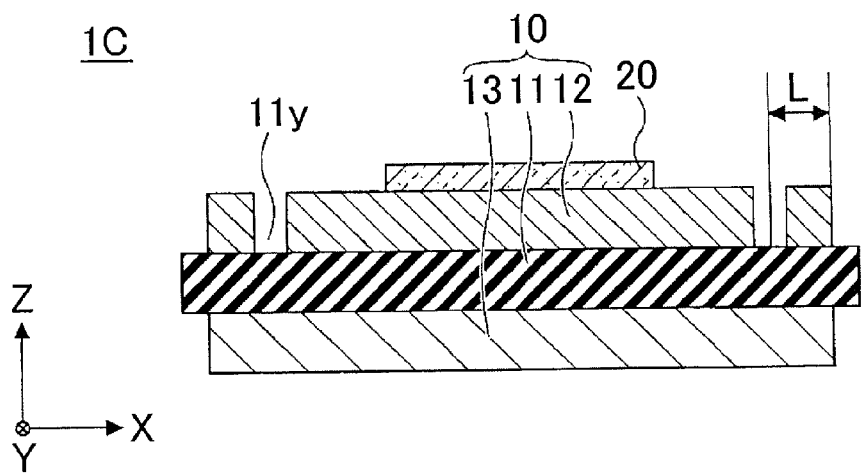
FIGS. 7A and 7B are views that exemplify the semiconductor device according to a modified example 3 of the first embodiment of the present invention.
Figure 7B:
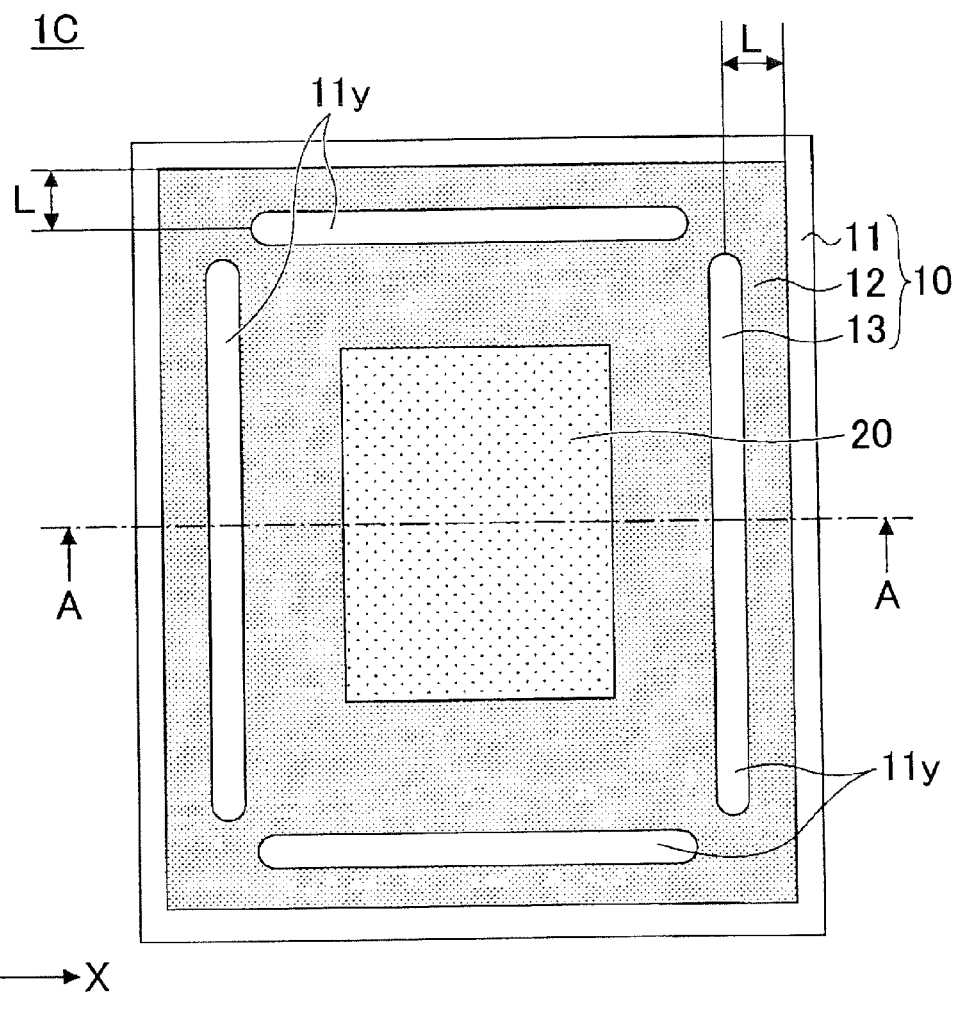

FIGS. 7A and 7B are views that exemplify the semiconductor device according to the modified example 3 of the first embodiment, FIG. 7A is a cross-sectional view, and FIG. 7B is a plan view. FIG. 7A shows a cross section taken along the line A-A of FIG. 7B.

As shown in FIGS. 7A and 7B, a semiconductor device 1C according to the modified example 3 of the first embodiment differs from the semiconductor device 1 according to the first embodiment (see FIGS. 1A and 1B, and FIGS. 2A and 2B) in that the exposed section 11x is replaced by an exposed section 11y.

In the semiconductor device 1C, the first metal layer 12 and the second metal layer 13 are provided such that the edge side of the first metal layer 12 substantially corresponds to the edge side of the second metal layer 13 in the plan view. Then, four slit-like openings are provided in an outer periphery of the first metal layer 12 to form the exposed section 11y. In other words, the exposed section 11y is four slit-like areas in an outer periphery on the one face of the transparent insulating layer 11.

The second metal layer 13 is provided on the other face of the transparent insulating layer 11 in a manner to include the exposed section 11y in the plan view, and an outer periphery of the second metal layer 13 can be visually recognized through the exposed section 11y.

As described above, it has been known from experiences that the characteristic defect or the like of the semiconductor device 1 caused by peeling or cracking does not occur even in consideration of aging if the degree of peeling or cracking detected in the initial inspection falls within the range of 0.5 mm or less from the edge side to the inner side of the second metal layer 13.

Accordingly, when a distance L that is from the edge side of the second metal layer 13 to the center of the slit is set to 0.5 mm in the exposed section 11y, a width (a length in a short side) of each of the slits is preferably set to about 0.5 mm. With the above, although a starting point of peeling or cracking in the second metal layer 13 cannot be checked, a determination can be made whether or not the peeling or cracking in the second metal layer 13 reaches 0.5 mm. That is, it is possible to check the most problematic portion.

Just as described, the exposed section 11y can be provided in a position that allows the visual recognition of a portion in the second metal layer 13 where checking of peeling or cracking is desired. Thus, this embodiment produces the same effect as that of the first embodiment. Here, the single or plural scribe lines may be provided in a position that allows the visual recognition of the exposed section 11y like the modified example of the first embodiment or the modified example 2 of the first embodiment.

In particular, it is preferred to provide the scribe line in the position where the distance from the edge side of the second metal layer 13 to the center of the each slit is 0.5 mm as this allows to easily determine whether or not the peeling or cracking of the second metal layer 13 is 0.5 mm or longer. The shape of the exposed section 11y is not limited to the slit shape but may be any shape that is appropriate for the inspection.

A modified example 4 of the first embodiment shows an example in which a fragile section is provided in the second metal layer. In the modified example 4 of the first embodiment, the description of the same components thereof as those that have already been described will not be repeated.

Figure 8A:
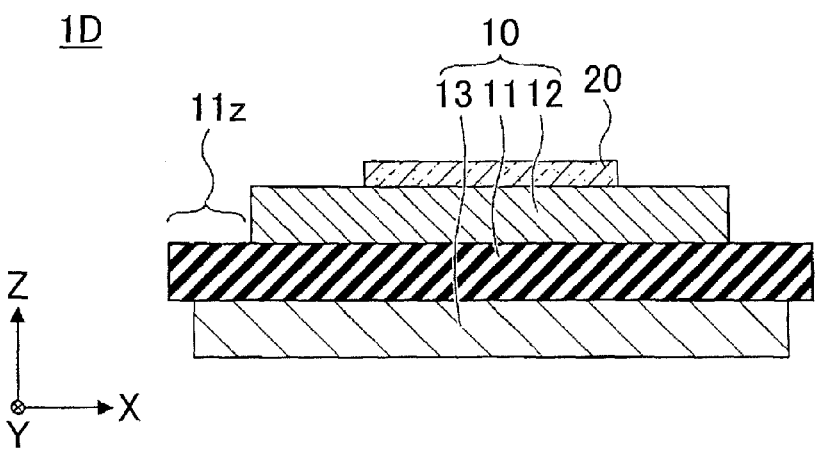
FIGS. 8A and 8B are views that exemplify the semiconductor device according to a modified example 4 of the first embodiment of the present invention.
Figure 8B:
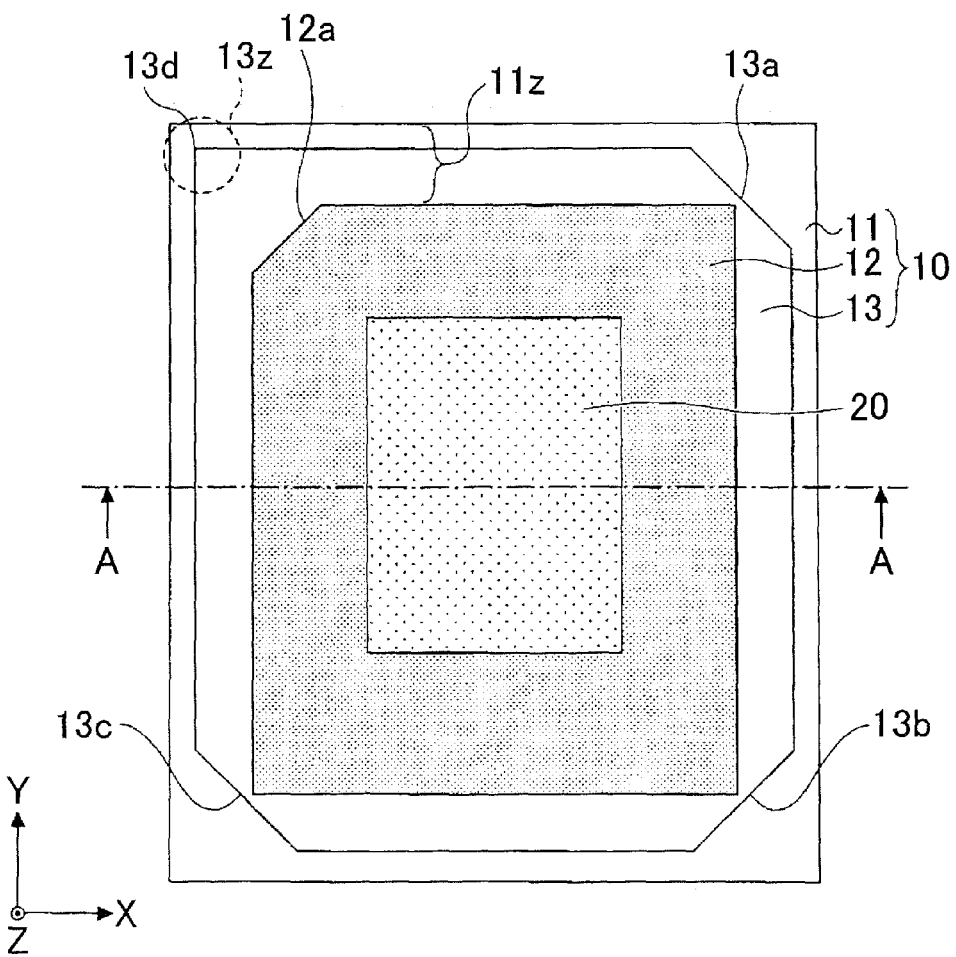

FIGS. 8A and 8B are views that exemplify the semiconductor device according to the modified example 4 of the first embodiment, FIG. 8A is a cross-sectional view, and FIG. 8B is a plan view. FIG. 8A shows a cross section taken along the line A-A of FIG. 8B.

As shown in FIGS. 8A and 8B, in a semiconductor device 1D according to the modified example 4 of the first embodiment, chamfered sections 13a, 13b, and 13c are formed at three corners of the second metal layer 13, but a chamfered section is not formed in another corner 13d, which is substantially at a right angle. In addition, in the first metal layer 12, a chamfered section 12a is formed at a corner that is positioned above and near the corner 13d of the second metal layer 13 in the plan view, but the rest of three corners are not formed with the chamfered section and are at substantially the right angle.

Each of the chamfered sections 12a, 13a, 13b, and 13c can be formed in a linear shape, one side of which is substantially angled at 45 degrees with respect to an adjacent side in the plan view, for example. At this time, a chamfer dimension can be about 2 mm to 10 mm, for example.

It is possible in the chamfered sections 13a, 13b, and 13c to relax concentration of the thermal stress by selectively chamfering the second metal layer 13 as described above. On the other hand, the thermal stress is concentrated in an area 13z in the proximity of the corner 13d, and the area 13z becomes the fragile section (thermal stress concentrated portion) to the thermal stress. Accordingly, the peeling or cracking of the second metal layer 13 is likely to be occurred from the corner 13d as a starting point toward the center. Because the chamfered section 12a is formed in the first metal layer 12, the area 13z can be easily and visually recognized through the exposed section 11z.

Just as described, in FIGS. 8A and 8B, the fragile section (thermal stress concentrated portion) where the thermal stress is concentrated is provided in the area of the second metal layer 13 that is overlapped with the exposed section 11z in the plan view. Accordingly, because the inspection can be mainly focused on this portion, an ability to determine the presence or absence and/or the degree of peeling or cracking can be improved. At this time, because the exposed section 11z is provided to widely expose an area around the fragile section than the other portions, it is possible to improve the visibility of the fragile section.

The single or plural scribe lines may be provided in the position where the scribe lines can be visually recognized through the exposed section 11y like the modified example 1 of the first embodiment and the modified example 2 of the first embodiment. In addition, the exposed section 11y may be provided such that only the area around the fragile section can be visually recognized like the modified example 3 of the first embodiment.

In a second embodiment of the present invention, an example is shown in which a transparent sealing section for covering the semiconductor element is provided. In the second embodiment, the description of the same components as those that have already been described in the other embodiment will not be repeated.

Figure 9:
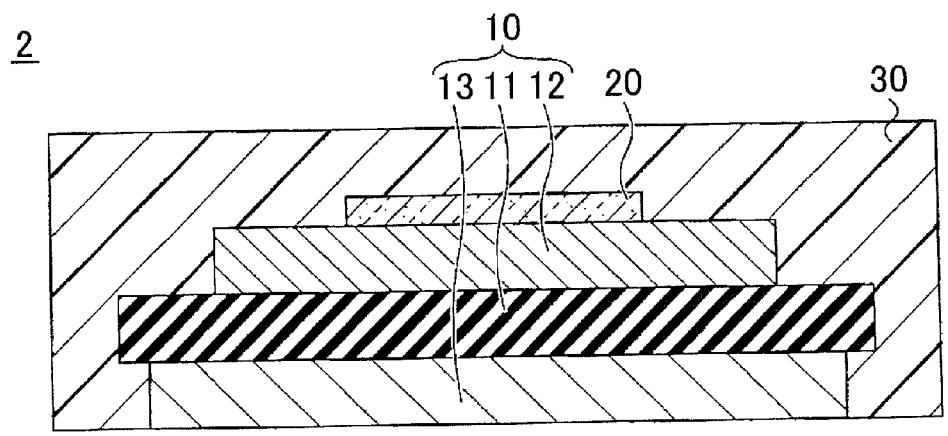
FIG. 9 is a cross-sectional view that exemplifies the semiconductor device according to a second embodiment of the present invention.

FIG. 9 is a cross-sectional view that exemplifies the semiconductor device according to the second embodiment. Referring to FIG. 9, a semiconductor device 2 has a structure in which the semiconductor device 1 (see FIGS. 1A and 1B) is provided with a sealing section 30. However, any one of the semiconductor devices 1A to 1D may be used instead of the semiconductor device 1.

The sealing section 30 is provided to cover the portion other than a back face of the second metal layer 13. The sealing section 30 can be formed of an insulating material such as an epoxy resin, for example, by transfer molding or the like. The semiconductor element 20 and the like can be protected from moisture, a contaminant, or the like by providing the sealing section 30.

The linear transmittance of the visible light in the sealing section 30 is preferably the same as or better than that in the transparent insulating layer 11. In other words, as the insulating material for the sealing section 30, the transparent epoxy resin or the like is preferably selected. With such a configuration, it is possible to visually recognize the peeling or cracking of the second metal layer 13 through the sealing section 30 and the exposed section of the transparent insulating layer 11 even after the sealing section 30 is provided. For example, aging of the semiconductor device 2 and the like can be checked not only before shipment thereof as a product but also after the shipment.

The back face of the second metal layer 13 that is exposed from the sealing section 30 may be joined to the heat spreader, the cooler, or the like by using grease or the like. When the second metal layer 13 is not joined to the heat spreader, the cooler, or the like, the sealing section 30 may be provided to cover the back face of the second metal layer 13.

In a third embodiment of the present invention, another example is shown in which the transparent sealing section for covering the semiconductor element is provided. In the third embodiment, the description of the same components as those in the embodiments that have already described will not be repeated.

Figure 10:
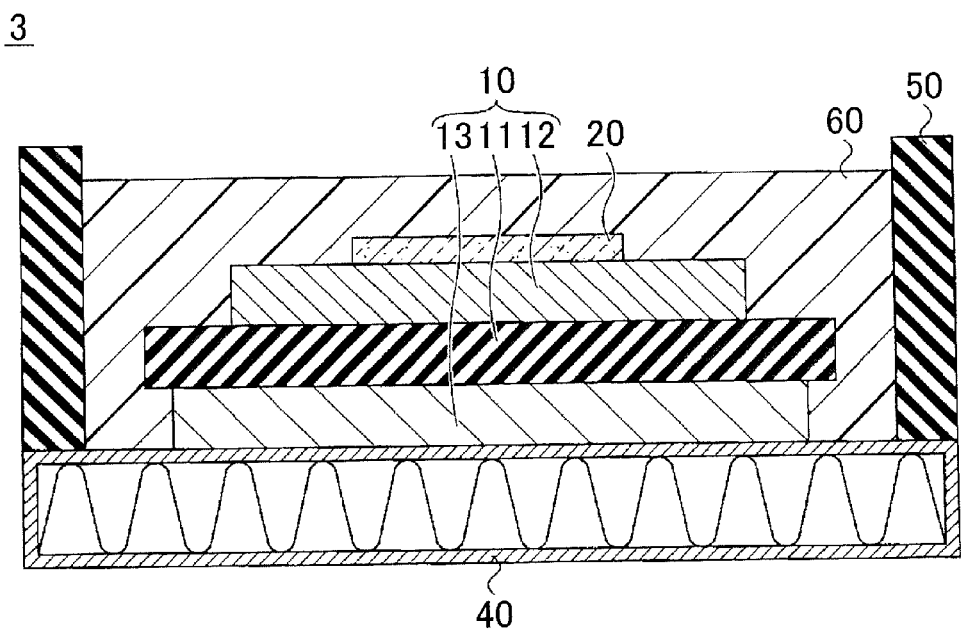
FIG. 10 is a cross-sectional view that exemplifies the semiconductor device according to a third embodiment of the present invention.

FIG. 10 is a cross-sectional view that exemplifies the semiconductor device according to the third embodiment. Referring to FIG. 10, a semiconductor device 3 has a structure in which the semiconductor device 1 (see FIGS. 1A and 1B) is mounted on a cooler 40. However, any one of the semiconductor devices 1A to 1D may be used instead of the semiconductor device 1.

In the semiconductor device 3, the second metal layer 13 side of the insulating substrate 10 is joined to the cooler 40. A housing 50 as a frame-shaped member is provided in an outer periphery of a face of the cooler 40 on the insulating substrate 10 side, and a sealing section 60 for covering the portion other than the back face of the second metal layer 13 is provided in the housing 50. As the cooler 40, for example, a water cooler (made of metal) that includes a heat radiating fin in a waveplate shape can be used. The housing 50 can be formed of a resin material or the like.

The sealing section 60 can be formed by, for example, injecting the insulating material such as silicone gel into the housing 50. The semiconductor element 20 and the like can be protected from moisture, a contaminant, or the like by providing the sealing section 60. When the sealing section 60 is formed of the silicone gel and the heat generation of the semiconductor element 20 generates the thermal stress, deformation of the silicone gel, which is possible by high flexibility thereof, allows relaxation of the thermal stress.

The linear transmittance of the visible light in the sealing section 60 is preferably the same as or better than that in the transparent insulating layer 11. With such a configuration, it is possible to visually recognize the peeling or cracking of the second metal layer 13 through the sealing section 60 and the exposed section of the transparent insulating layer 11 even after the sealing section 60. For example, aging or the like of the semiconductor device 3 can be checked not only before shipment thereof as a product but also after the shipment.

Although the back face of the second metal layer 13 and the cooler 40 are joined to each other by using flux, for example, there is a case where the thermal stress is generated between the transparent insulating layer 11 and the second metal layer 13 in a joining step using the flux, thereby causing the peeling or cracking in the second metal layer 13. In this case, because the sealing section 60 is formed transparent, it is possible to inspect the peeling or cracking of the second metal layer 13 after the sealing section 60 is provided.

The preferred embodiments and the modified examples thereof have been described so far in detail. However, the present invention is not limited to the above-mentioned embodiments and the modified examples, and various modifications or replacements can be made to the above-mentioned embodiments and the modified examples without departing from the scope of the claims.

What is claimed is:

1. An insulating substrate comprising:
a transparent insulating layer;
a first metal layer that is provided on a first face of the transparent insulating layer;
a second metal layer that is provided on a second face of the transparent insulating layer that is opposite from the first face;
an exposed section of the first face of the transparent insulating layer that is an area not provided with the first metal layer;
an area of the second metal layer that is overlapped with the exposed section when seen in an orthogonal direction to the first face; and
a linear groove formed on the second face of the transparent insulating layer in the area that is overlapped with the exposed section when seen in the orthogonal direction.

2. The insulating substrate according to claim 1, further comprising:
another linear groove formed on an inner side of the linear groove of the second face of the transparent insulating layer in the area that is overlapped with the exposed section when seen in the orthogonal direction.

3. The insulating substrate according to claim 1 wherein the linear groove is formed in a position that matches an edge side of the second metal layer when seen in the orthogonal direction.

4. The insulating substrate according to claim 1 wherein a thickness of the transparent insulating layer is 0.2 mm to 1.5 mm.

5. The insulating substrate according to claim 1 wherein when the transparent insulating layer has a thickness of 1.5 mm, linear transmittance of a visible light in the transparent insulating layer is 20% or higher.

6. The insulating substrate according to claim 1 wherein a length of the exposed section in a direction perpendicular to a longitudinal direction of the exposed section is 0.5 mm to 1.0 mm when seen in the orthogonal direction to the first face.

7. A semiconductor device comprising:
the insulating substrate according to claim 1; and
a semiconductor element that is mounted on the first metal layer.

8. The semiconductor device according to claim 7 further comprising:
a transparent sealing section that covers the semiconductor element and is located on the insulating substrate.

9. The semiconductor device according to claim 8 further comprising
a cooler that is joined to a side of the second metal layer of the insulating substrate.

10. The semiconductor device according to claim 8, wherein
linear transmittance of a visible light in the transparent sealing section is higher than linear transmittance in the transparent insulating layer.

11. An insulating substrate comprising:
a transparent insulating layer;
a first metal layer that is provided on a first face of the transparent insulating layer;
a second metal layer that is provided on a second face of the transparent insulating layer that is opposite from the first face;
an exposed section of the first face of the transparent insulating layer that is an area not provided with the first metal layer, the exposed section being provided on at least one of a corner of the second metal layer and an edge side of the second metal layer when seen in an orthogonal direction of the first face;
are area of the second metal layer that is overlapped with the exposed section when seen in the orthogonal direction to the first face; and
a fragile section where thermal stress is concentrated provided in the area of the second metal layer that is overlapped with the exposed section when seen in the orthogonal direction.

12. A method of manufacturing an insulating substrate comprising:
forming a first linear groove and a second linear groove on a face of a substrate;
forming a transparent insulating layer by cutting the substrate along the first linear groove to divide the substrate into individual pieces;
forming, in a first face of the transparent insulating layer, a portion that is provided with a first metal layer and forming, in the first face, an exposed section that is an area not provided with the first metal layer; and
forming a second metal layer on a second face of the transparent insulating layer in a manner to include an area that is overlapped with the exposed section when seen in an orthogonal direction to the first face, wherein
the first face is located opposite from the second face with respect to the transparent insulating layer, and
the second linear groove is formed in the area of the transparent insulating layer that is overlapped with the exposed section when seen in the orthogonal direction to the first face.

13. The method of manufacturing an insulating substrate according to claim 12 further comprising:
at the same time when the second linear groove is formed, forming a third linear groove on an inner side of the second linear groove that is formed on the second face in the area of the transparent insulating layer that is overlapped with the exposed section when seen in the orthogonal direction.

14. The method of manufacturing an insulating substrate according to claim 13 wherein
the third linear groove is formed parallel to the second linear groove.

* * * * *